United States Patent
Lee et al.

(10) Patent No.: US 8,258,623 B2
(45) Date of Patent: Sep. 4, 2012

(54) CIRCUIT LAYOUT OF CIRCUIT SUBSTRATE, LIGHT SOURCE MODULE AND CIRCUIT SUBSTRATE

(75) Inventors: Hsiang-Chao Lee, Taoyuan County (TW); Yi-Nan Chu, Changhua County (TW); Hun-Hsiang Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 533 days.

(21) Appl. No.: 12/538,180

(22) Filed: Aug. 10, 2009

(65) Prior Publication Data
US 2010/0290227 A1 Nov. 18, 2010

(30) Foreign Application Priority Data
May 12, 2009 (TW) ................................ 98115712 A

(51) Int. Cl.
*H01L 23/52* (2006.01)
(52) U.S. Cl. .................... 257/734; 362/249.02; 174/261; 438/28
(58) Field of Classification Search ............. 362/249.02; 174/261
See application file for complete search history.

(56) References Cited

U.S. PATENT DOCUMENTS

| 4,700,210 | A  | * | 10/1987 | Burton et al. ................... 257/95 |
| 6,682,211 | B2 | * | 1/2004 | English et al. ................ 362/545 |
| 6,870,325 | B2 | * | 3/2005 | Bushell et al. ................ 315/224 |
| 7,193,320 | B2 | * | 3/2007 | Hosoyamada et al. ....... 257/738 |
| 2007/0085174 | A1 | * | 4/2007 | Wheless et al. ............... 257/666 |

FOREIGN PATENT DOCUMENTS
CN 1971895 5/2007
TW 200612576 4/2006

* cited by examiner

*Primary Examiner* — Julio J Maldonado
*Assistant Examiner* — Robert Bachner
(74) *Attorney, Agent, or Firm* — Jianq Chyun IP Office

(57) ABSTRACT

A circuit layout of a circuit substrate having a plurality of device bonding areas is provided. The circuit layout includes first pads, second pads, bridging lines, first outer leads and second outer leads. Each device bounding area is configured with one first pad and one second pad. The bridging lines are respectively disposed between any two adjacent device bounding areas and extended from a side of the first pad inside one device bounding area to a side of the second pad inside another one device bounding area adjacent to the first pad. Each first outer lead and each second outer lead are respectively corresponding to one first pad and one second pad, are respectively correspondingly extended into the device bounding area which the first pad and the second pad are located at, and are beside the first pad and the second pad correspondingly.

12 Claims, 8 Drawing Sheets

CIRCUIT LAYOUT OF CIRCUIT SUBSTRATE, LIGHT SOURCE MODULE AND CIRCUIT SUBSTRATE

CROSS-REFERENCE TO RELATED APPLICATION

This application claims the priority benefit of Taiwan application serial no. 98115712, filed May 12, 2009. The entirety of the above-mentioned patent application is hereby incorporated by reference herein and made a part of specification.

BACKGROUND OF THE INVENTION

1. Field of the Invention

The present invention relates to a circuit substrate, and more particularly, to a circuit layout of the circuit substrate and a light source module applied with the circuit layout of the circuit substrate.

2. Description of Related Art

Due to the characteristics of the LEDs of long lifespan and little electricity consumption, fluorescent lamps and incandescent bulbs are gradually replaced with the LEDs in some fields, such as a scanning light source which requires high reaction speed, a backlight source of a liquid crystal display (LCD) device, car dashboard illumination for a car with front light source, traffic signs, large electronic display bulletins and general illumination devices.

Generally, the series and parallel connection of the LEDs of a light bar is decided by a circuit layout of a circuit substrate while the circuit layout of the circuit substrate is laid out according to the voltage and the current provided by a power supply. However, there are various types of LEDs, that is to say, the driving voltage and the driving current of LEDs are not consistent. Accordingly, the best luminance effect of the light bar is not easily obtained when the light bar is disposed on the laid-out circuit substrate because the circuit layout of the circuit substrate may not comply with the characteristic of LEDs, and thus the appearance and the cost of the circuit substrate is undesirable affected by modifying the circuit layout for making the circuit layout of the circuit substrate comply with the characteristic of LEDs.

For example, if the original circuit layout of the circuit substrate is designed as a circuit with four elements connected in series, the circuit layout is needed to be modified into a circuit with two parallel series each composed of two serially connected elements when the transformation efficient testing is processed. Nevertheless, the series and parallel connection of the elements in the circuit layout is incapable of being modified after the circuit substrate laid-out. Therefore, additional wire jumping, additional wire opening, or re-set up is needed to obtain the required series and parallel connection of the elements in the circuit layout. Accordingly, the manufacturing cost and the time consumption are increased.

In addition, a through hole must be configured in the transmission path of the signal-to-be-measured when the signal or the voltage of the inner circuit in the conventional circuit substrate is going to be measured. The through hole not only has negative influence on the continuity of the upper and lower traces of the circuit substrate, but also renders the trace area and the turning angles increased. Therefore, the interference and the antenna effect between traces in different layers are generated.

SUMMARY OF THE INVENTION

The present invention provides a circuit layout of a circuit substrate capable of selectively controlling the series and parallel connection of a circuit.

The present invention provides a light source module, wherein the bridging between the circuit layout and the LEDs renders a user to efficiently accomplish the sharing of a circuit substrate and the control of the option of switching the series and parallel connection of the leads of the LEDs.

The present invention provides a circuit substrate capable of letting a user efficiently measure the signal of the inner conductive layer.

The present invention provides a circuit layout of a circuit substrate, wherein the circuit substrate has a plurality of device bounding areas, and the circuit layout includes a plurality of first pads, a plurality of second pads, a plurality of bridging lines, a plurality of first outer leads and a plurality of second outer leads. Each of the device bounding areas is provided with one first pad and one second pad. The bridging lines are respectively disposed between any two adjacent device bounding areas and extended from a side of the first pad inside one of the device bounding areas to a side of the second pad inside another one device bounding area adjacent to the first pad. Each of the first outer leads and each of the second outer leads are respectively corresponding to one first pad and one second pad, each of the first outer leads and each of the second outer leads are respectively correspondingly extended into the device bounding area which the first pad and the second pad are located at, and each of the first outer leads and each of the second outer leads are beside the first pad and the second pad.

In an embodiment of the present embodiment, each of the first pads are selectively bridged to the corresponding first outer lead or the bridging line, and each of the second pads are selectively bridged to the corresponding second outer lead or the bridging line.

In an embodiment of the present embodiment, each of the first pads and each of the second pads are respectively bridged to the corresponding first outer lead and the corresponding second outer lead so as to form a single loop inside each of the device bounding areas.

In an embodiment of the present invention, every two or more adjacent device bounding areas are group by at least one bridging line therebetween to bridge the corresponding first pad and the corresponding second pad together, and the remaining first pad and the remaining second pad are respectively bridged to the corresponding first outer lead and the corresponding second outer lead so as to form a series loop serially connecting the device bounding areas inside each of the groups.

In an embodiment of the present invention, all the bridging lines respectively bridge the corresponding first pads and the corresponding second pads together, and the remaining first pad and the remaining second pad located at two ends are respectively bridged to the corresponding first outer lead and the corresponding second outer lead so as to form a series loop serially connecting all the device bounding areas.

In an embodiment of the present invention, the circuit layout of the circuit substrate further includes a conductive material. The conductive material is disposed at a juncture of the first pads and their corresponding first outer leads or bridging lines, and at a juncture of the second pads and their corresponding second outer leads or bridging lines.

In an embodiment of the present invention, the conductive material includes a solder.

The present invention provides a light source module including a circuit substrate and a plurality of LEDs. The circuit substrate includes a first dielectric layer, a second dielectric layer and a patterned metal layer. The second dielectric layer has a plurality of openings. The patterned metal layer is disposed between the first dielectric layer and second dielectric layer. The openings of the second dielectric layer expose a portion of the patterned metal layer and the portion of the patterned metal layer exposed by the openings forms a plurality of device bounding areas and a circuit layout. The circuit layout includes a plurality of first pads, a plurality of second pads, a plurality of bridging lines, a plurality of first outer leads and a plurality of second outer leads. Each of the device bounding areas is provided with one first pad and one second pad. The bridging lines are respectively disposed between any two adjacent device bounding areas and extended from a side of the first pad inside one of the device bounding areas to a side of the second pad inside another one device bounding area adjacent to the first pad. Each of the first outer leads and each of the second outer leads are respectively corresponding to the first pad and the second pad, each of the first outer leads and each of the second outer leads are respectively correspondingly extended into the device bounding area which the first pad and the second pad are located at, and each of the first outer leads and each of the second outer leads are beside the first pad and the second pad. The LEDs are respectively disposed inside the device bounding areas. Each of the LEDs has a first lead and a second lead, wherein the first lead is disposed on the corresponding first pad, and the second lead is disposed on the corresponding second pad. The first lead is selectively bridged to the corresponding first outer lead or the bridging line, and the second lead is selectively bridged to the corresponding second outer lead or the bridging line.

In an embodiment of the present embodiment, each of the first leads and each of the second leads are respectively connected to the corresponding first outer lead and the corresponding second outer lead so as to form a single loop inside each of the device bounding areas.

In an embodiment of the present invention, every two or more adjacent device bounding areas forms a group by at least one bridging line therebetween to connect the corresponding first lead and the corresponding second lead together, and the remaining first lead and the remaining second lead are respectively connected to the corresponding first outer lead and the corresponding second outer lead so as to form a series loop serially connecting the device bounding areas inside each of the groups.

In an embodiment of the present invention, all the bridging lines respectively connect the corresponding first leads and the corresponding second leads together, the remaining first lead and the remaining second lead located at two ends are respectively connected to the corresponding first outer lead and the corresponding second outer lead so as to form a series loop serially connecting all the device bounding areas.

In an embodiment of the present invention, the light source module further includes a conductive material. The conductive material is disposed at a juncture of the first leads and their corresponding first outer leads or bridging lines, and at a juncture of the second leads and their corresponding second outer leads or bridging lines.

In an embodiment of the present invention, the conductive material includes a solder.

The present invention provides a circuit substrate including a base layer, a plurality of dielectric layer and a plurality of conductive layer. The dielectric layers are disposed on the base layer. The conductive layers are disposed on the base layer, and the conductive layers and the dielectric layers are interlaced with one another. The circuit substrate is configured with an opening penetrating the dielectric layers and the conductive layers, and a bore diameter of the opening is corresponding to each of the dielectric layers and each of the conductive layers, and is gradually reduced toward the base layer such that each of the dielectric layers exposes the underlying dielectric layers and the conductive layers through the opening.

In an embodiment of the present invention, the circuit substrate further includes a conductive material. The conductive material is disposed in the opening and covers the underlying dielectric layers and the underlying conductive layers exposed by the opening so as to electrically connect all the conductive layers.

In an embodiment of the present invention, the conductive material includes a solder.

In an embodiment of the present invention, the circuit substrate further includes at least a passive element. The passive element is disposed inside the opening and located on a portion of the conductive layers exposed by the opening. The passive element has a first connection portion and a second connection portion, wherein each of the dielectric layers exposes the underlying conductive layers through the opening to provide at least one first pad and at least one second pad, and the first connection portion and the second connection portion are respectively bridged to the at least one first pad and the at least one second pad.

In an embodiment of the present invention, the passive element is a resistor.

In an embodiment of the present invention, the circuit substrate further includes a conductive material. The conductive material is disposed at a juncture of the first connection portion and the at least one first pad and at a juncture the second connection portion and the at least one second pad.

In an embodiment of the present invention, the conductive material includes a solder.

In an embodiment of the present invention, the base layer includes a dielectric layer.

In an embodiment of the present invention, the base layer includes a multi-layer plate. The multi-layer plate is formed by a plurality of dielectric layers and at least one metal layer interlaced with one another.

In view of the above, the circuit layout of the present invention is designed to be constructed by the first pads, the second pads, the bridging lines, and the outer leads. The first leads and the second leads of LEDs are respectively disposed on the corresponding first pads and the corresponding second pads. Therefore, the LEDs are selectively bridged to the corresponding outer leads or the corresponding bridging lines through the first leads and the second leads to form different loop design. Accordingly, the circuit substrate having the circuit layout of the present invention is capable of letting the LEDs be selectively serially connected together or parallel connected together to accomplish different light source modules. That is to say, the circuit substrate of the present invention is capable of being used in various light source modules with different circuit designs, and the utility of the circuit substrate of the present invention is largely improved.

In addition, the circuit substrate of the present invention is configured with the opening penetrating the dielectric layers and the conductive layers, and the bore diameter of the opening corresponding to each of the dielectric layers or each of the conductive layers is gradually reduced toward the base layer, which makes each of the dielectric layers expose the underlying dielectric layers and the conductive layers through the opening, and therefore, the user is capable of directly measuring the signal of a portion of the conductive layers exposed by the opening through the opening, and electrically connecting numbers of conductive layers through the conductive material as needed. Thus, the effect of electromagnetic interference (EMI) in the circuit substrate is alleviated.

Furthermore, when the passive elements are disposed inside the opening of the dielectric layer adjacent to the base layer, numbers of the conductive layers are electrically connected by bridging the passive elements and the pads as needed, and thus additional jump pins or resistors are not required. Accordingly, the circuit substrate of the present invention is capable of letting the user efficiently measure the signal of the inner conductive layers.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
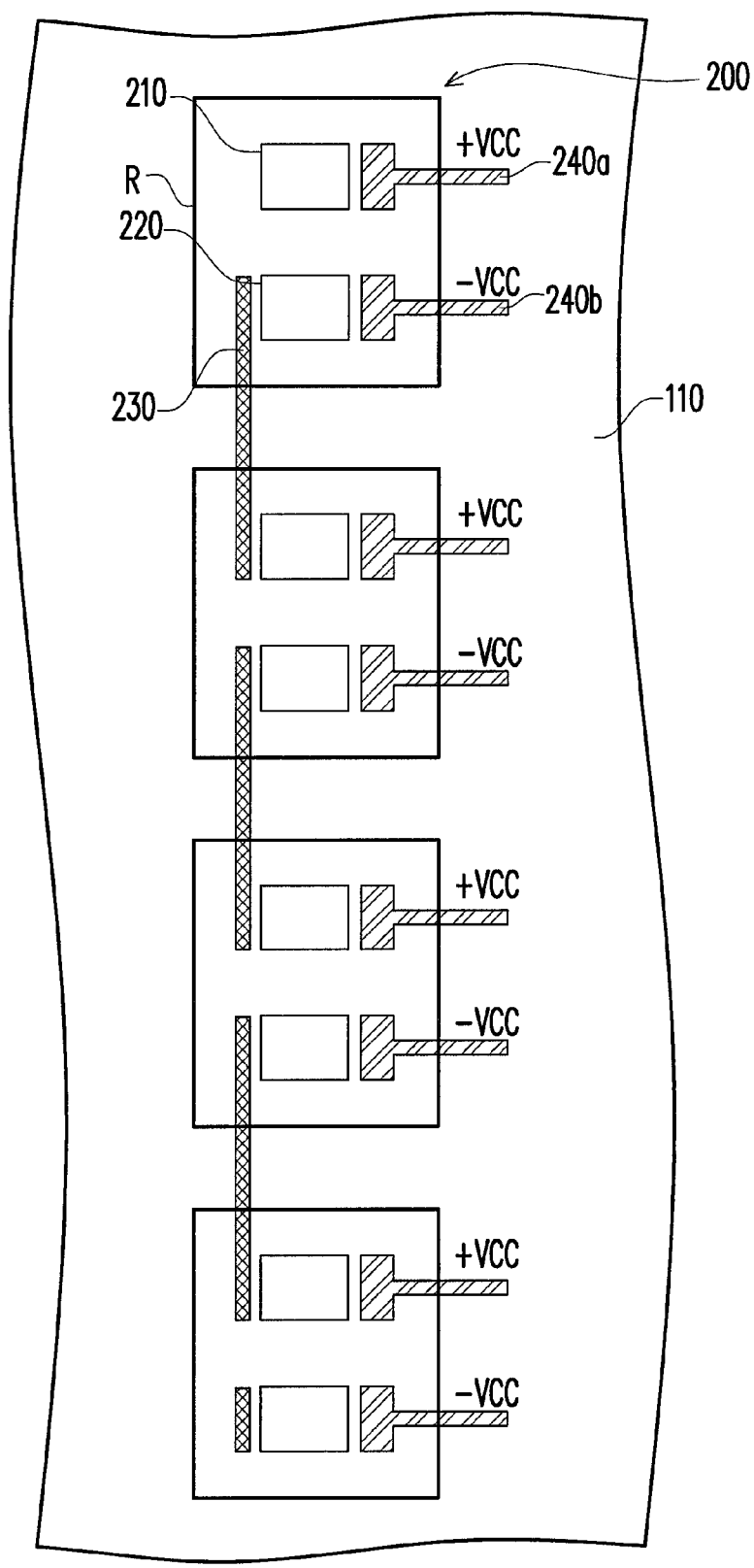
FIG. 1 is a schematic top view of a circuit layout of a circuit substrate according to an embodiment of the present invention.
Figure 2A:
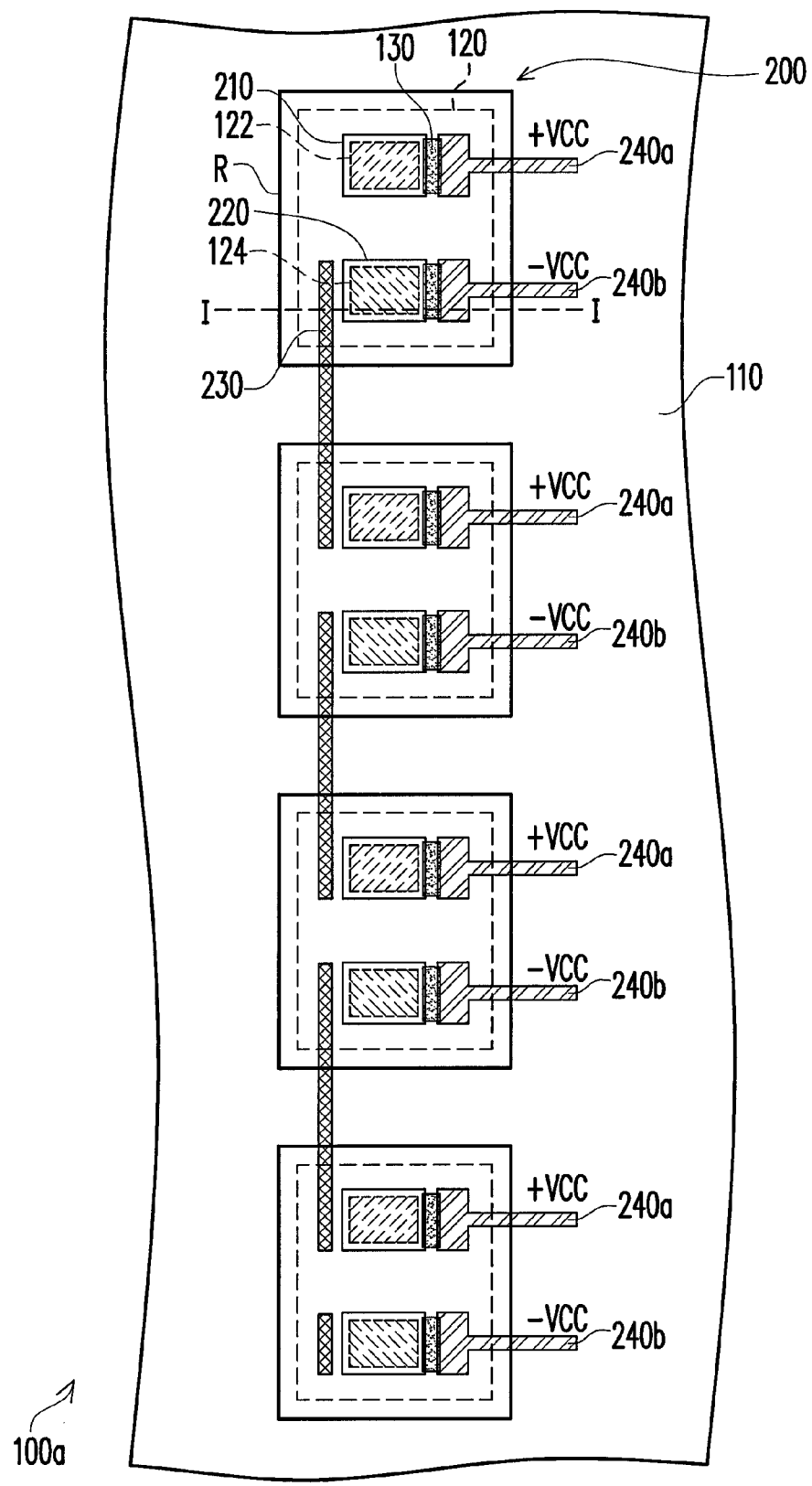
FIG. 2A is a schematic top view of a light source module applying the circuit layout of the circuit substrate of FIG. 1 according to an embodiment of the present invention.
Figure 2B:
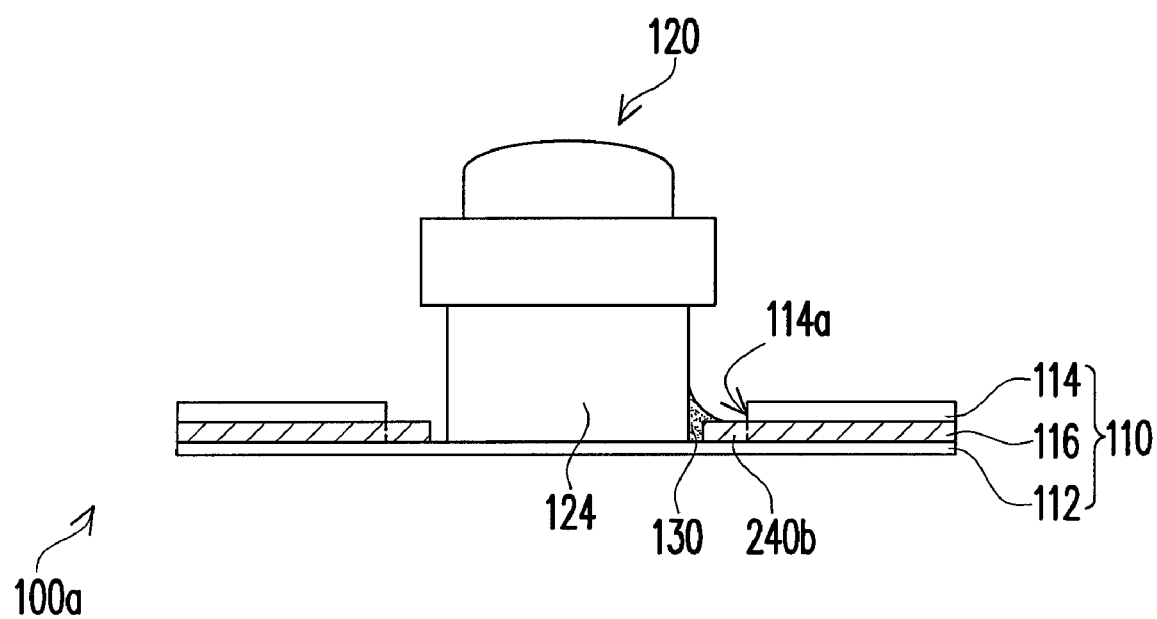
FIG. 2B is a schematic cross-sectional view taken along Line I-I in FIG. 2A.

FIG. 1 is a schematic top view of a circuit layout of a circuit substrate according to an embodiment of the present invention, FIG. 2A is a schematic top view of a light source module applying the circuit layout of the circuit substrate of FIG. 1 according to an embodiment of the present invention, and FIG. 2B is a schematic cross-sectional view taken along Line I-I in FIG. 2A. Referring to FIGS. 1, 2A and 2B simultaneously, the light source module 100a includes a circuit substrate 110 and a plurality of LEDs 120 in the present embodiment. The circuit substrate 110 includes a first dielectric layer 112, a second dielectric layer 114 and a patterned metal layer 116 disposed between the first dielectric layer 112 and the second dielectric layer 114. The second dielectric layer 114 has a plurality of openings 114a, and the openings 114a of the second dielectric layer 114 expose a portion of the patterned metal layer 116 while the portion of the patterned metal layer 116 exposed by the openings 114a forms a plurality of device bounding area R and a circuit layout 200.

In detail, referring to FIG. 1, the circuit layout 200 includes a plurality of first pads 210, a plurality of second pads 220, a plurality of bridging lines 230, a plurality of first outer leads 240a and a plurality of second outer leads 240b. Each of the device bounding areas R is provided with one first pad 210 and one second pad 220. The bridging lines 230 are respectively disposed between any two adjacent device bounding areas R and extended from a side of the first pad 210 inside one of the device bounding areas R to a side of the second pad 220 inside another one device bounding area R adjacent to the first pad 210. Each of the first outer leads 240a is corresponding to one first pad 210, and each of the second outer leads 240b is corresponding to one second pad 220. The first outer leads 240a and the second outer leads 240b are respectively correspondingly extended into the device bounding area R which the first pad 210 and the second pad 220 are located at, and the first outer leads 240a and the second outer leads 240b are beside the first pad 210 and the second pad 220.

Referring to FIGS. 2A and 2B, the LEDs 120 are respectively disposed inside the device bounding areas R. Each of the LEDs 120 has a first lead 122 and a second lead 124, wherein the first lead 122 is disposed on the corresponding first pad 210, and the second lead 124 is disposed on the corresponding second pad 220. The first lead 122 is selectively connected to the corresponding first outer leads 240a or the bridging lines 230, and the second lead 124 is selectively connected to the corresponding second outer leads 240b or the bridging lines 230.

In the present embodiment, the circuit layout 200 is designed to be constructed by the first pads 210, the second pads 220, the bridging lines 230, the first outer leads 240a and the second outer leads 240b. The first leads 122 and the second leads 124 of the LEDs 120 are respectively disposed on the corresponding first pads 210 and the corresponding second pads 220, and thus different loops are formed in the light source module 100a by selectively connecting the first leads 122 of the LEDs 120 to the corresponding first outer leads 240a or bridging lines 230, and selectively connecting the second leads 124 to the corresponding second outer leads 240b or the bridging lines 230. That is to say, the light source module 100a of the present embodiment is capable of forming different loop designs according to the user's requirements such that the user is capable of using the circuit substrate 110 in various light source modules with different circuit designs by selectively serially or parallelly connecting the LEDs 120 and thus reducing manufacturing cost.

Three different embodiments are represented in the following to distinctly describe the different loops of the light source modules 100a, 100b and 100c by bridging the LEDs 120 (120a~102d) and the circuit layout 200.

Referring to FIGS. 2A and 2B simultaneously, the light source module 100a is configured by respectively disposing four LEDs 120 inside four device bounding areas R of the circuit substrate 110. The first leads 122 and the second leads 124 of the LEDs 120 are respectively disposed on the corresponding first pads 210 and the corresponding second pads 220, and the first leads 122 of the LEDs 120 are connected to the corresponding bridging lines 230 or the first outer leads 240a of the circuit substrate 110 through a conductive material 130, and the second leads 124 are connected to the corresponding bridging lines 230 or the second outer leads 240b of the circuit substrate 110, wherein the conductive material 130 includes a solder.

In detail, the conductive material 130 is disposed at a juncture of the first lead 122 of each of the LEDs 120 and its corresponding first outer lead 240a, and a juncture of the second lead 124 of each of the LEDs 120 and its corresponding second outer lead 240b such that the first lead 122 and the second lead 124 of each of the LEDs 120 are respectively connected to the corresponding first outer lead 240a and the corresponding second outer lead 240b to form a single loop inside each of the device bounding area R while the loop of the four device bounding areas R is a circuit having four elements parallel-connected. That is to say, in the light source module 100a of the present embodiment, a circuit having four elements parallel-connected can be formed by bridging the circuit layout 200 and the LEDs 120.

Figure 3A:
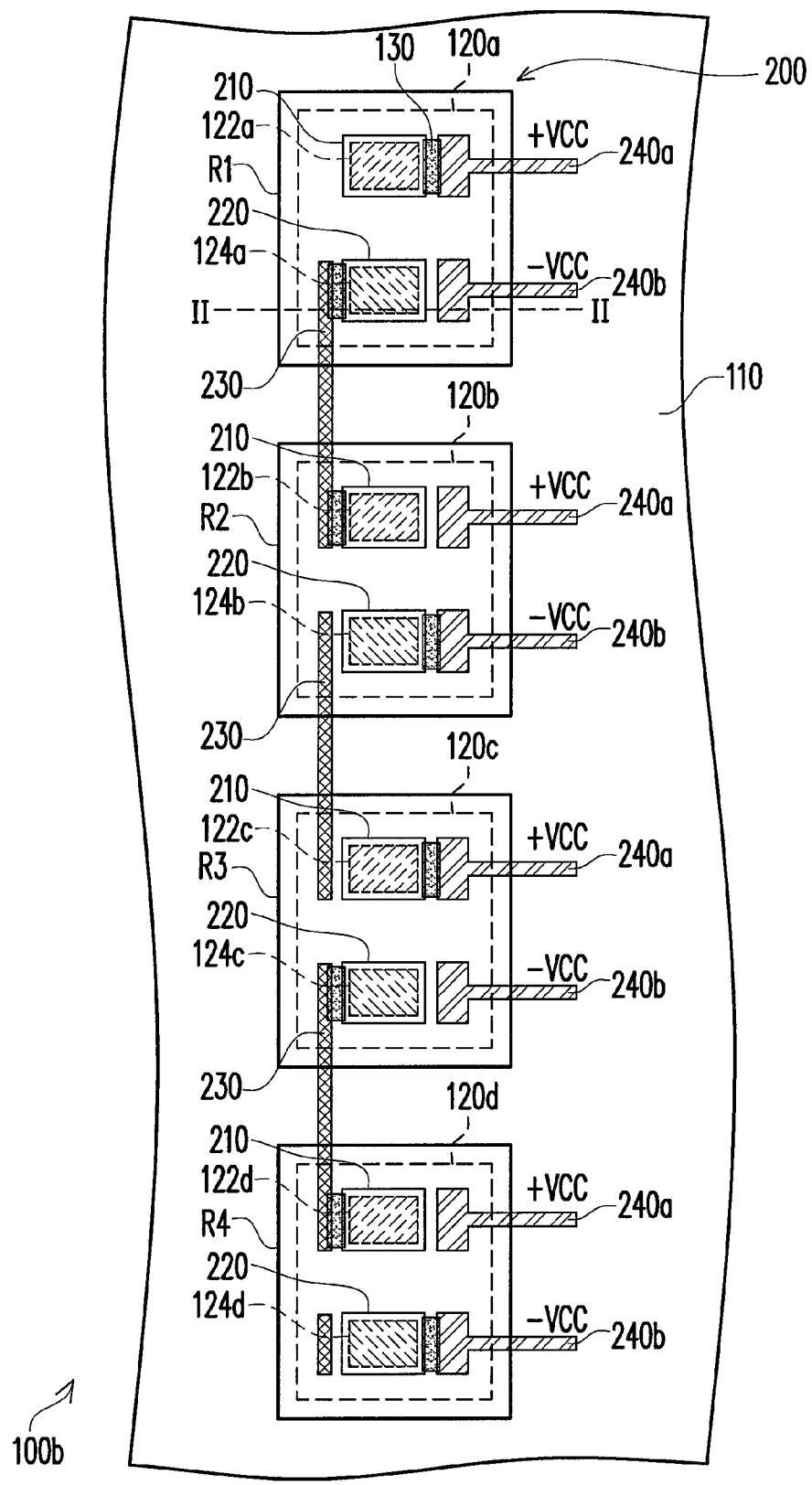
FIG. 3A is a schematic top view of a light source module according to another embodiment of the present invention.
Figure 3B:
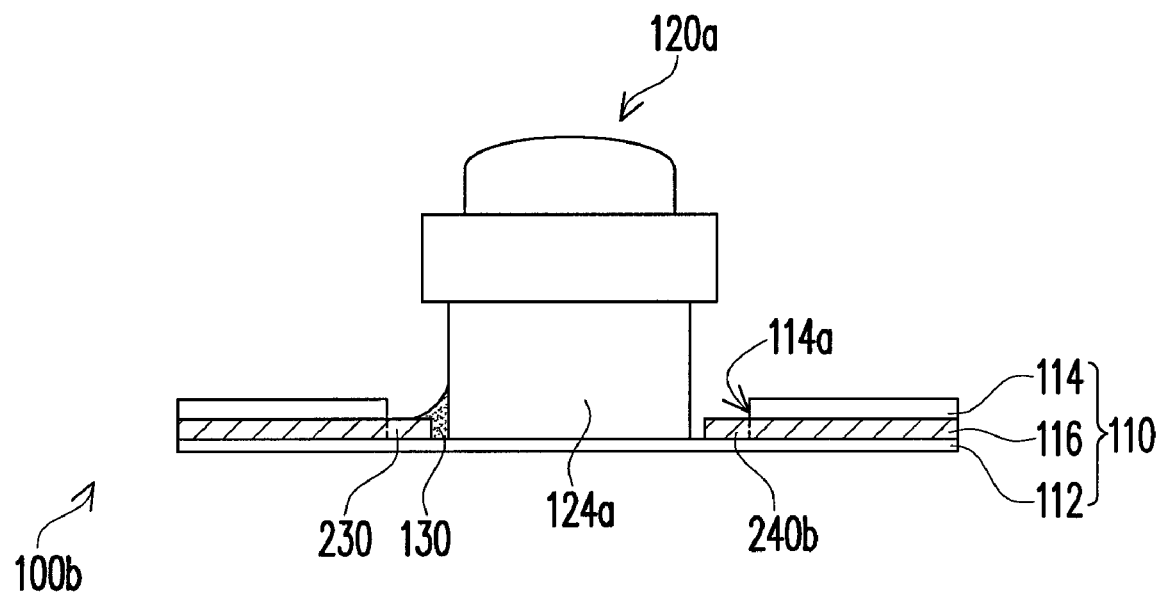
FIG. 3B is a schematic cross-sectional view taken along Line II-II in FIG. 3A.

FIG. 3A is a schematic top view of a light source module according to another embodiment of the present invention, and FIG. 3B is a schematic cross-sectional view taken along Line II-II in FIG. 3A. Referring to FIGS. 3A and 3B simultaneously, the light source module 100b of FIG. 3A is configured by respectively disposing four LEDs 120a~120d inside four device bounding areas R1~R4 of the circuit substrate 110, wherein every two adjacent device bounding areas R1 and R2 (or R3 and R4) forms a group.

Specifically, the second lead 124a of the LED 120a inside the device bounding area R1 and the first lead 122b of the LED 120b inside the device bounding area R2 are connected to the bridging line 230 between the device bounding areas R1 and R2 through conductive material 130, and the first lead 122a of the LED 120a inside the device bounding area R1 and the second lead 124b of the LED 120b inside the device bounding area R2 are respectively connected to the corresponding first outer lead 240a and the corresponding second outer lead 240b through the conductive material 130 so as to form a series loop serially connecting the device bounding areas R1 and R2.

Similarly, the second lead 124c of the LED 120c inside the device bounding area R3 and the first lead 122d of the LED 120d inside the device bounding area R4 are connected to the bridging line 230 between the device bounding areas R3 and R4 through conductive material 130, and the first lead 122c of the LED 120c inside the device bounding area R3 and the second lead 124d of the LED 120d inside the device bounding area R4 are respectively connected to the corresponding first outer lead 240a and the corresponding second outer lead 240b through the conductive material 130 so as to form a series loop serially connecting the device bounding areas R3 and R4. That is to say, the light source module 100b of the present embodiment forms a loop with two parallel series each composed of two serially connected elements through bridging the circuit layout 200 and the LEDs 120a~120d.

Figure 4:
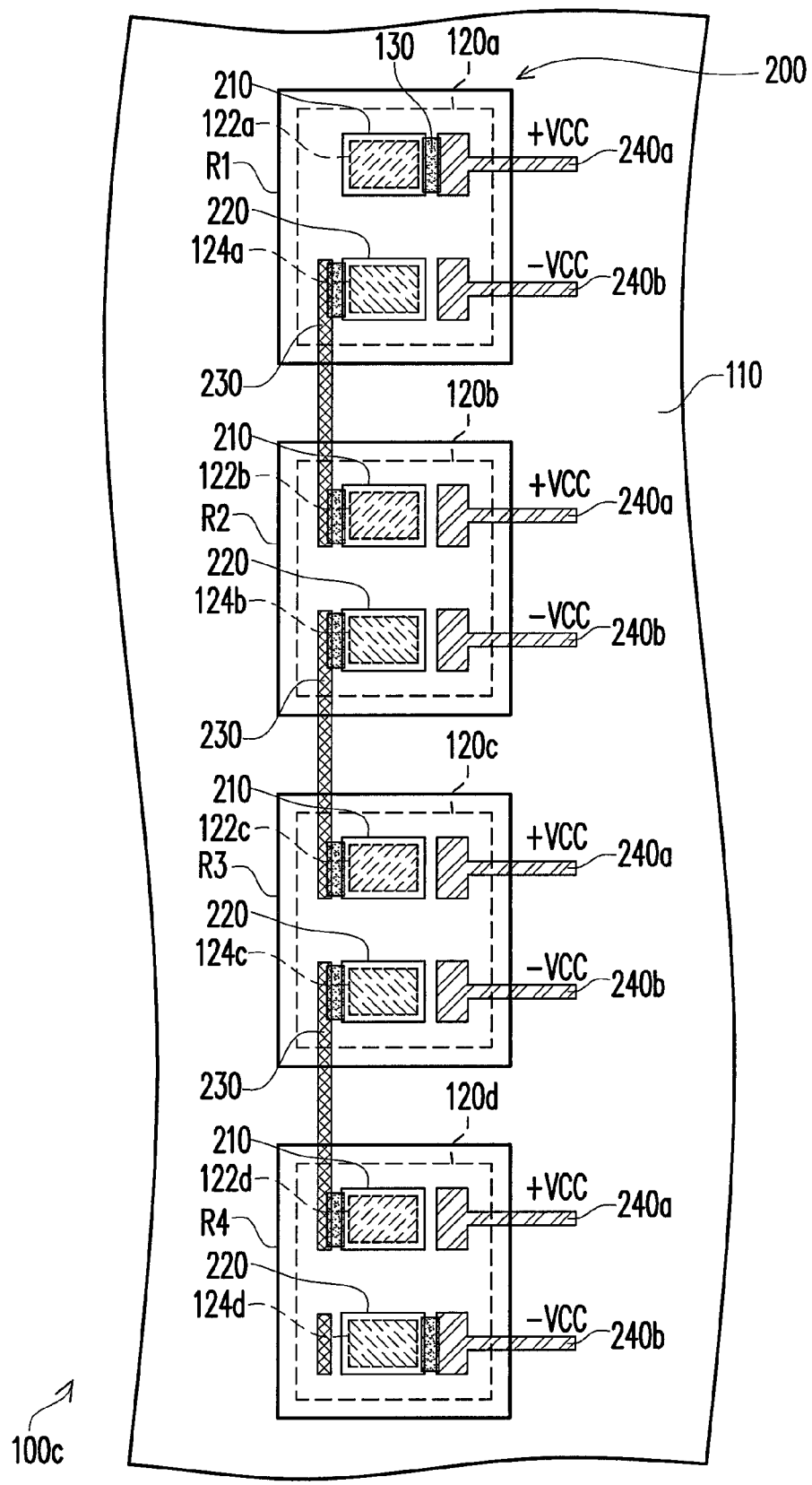
FIG. 4 is a schematic top view of a light source module according to another embodiment of the present invention.

FIG. 4 is a schematic top view of a light source module according to another embodiment of the present invention. Referring to FIG. 4, the light source module 100c of FIG. 4 is composed of four LEDs 120a~120d respectively disposed inside four device bounding areas R1~R4 of the circuit substrate 100 in the present embodiment.

In detail, the second lead 124a of the LED 120a inside the device bounding area R1, the first lead 122b and the second lead 124b of the LED 120b inside the device bounding area R2, the first lead 122c and the second lead 124c of the LED 120c inside the device bounding area R3 and the first lead 122d of the LED 120d inside the device bounding area R4 are respectively connected to the corresponding bridging lines 230 through the conductive material 130, and the first lead 122a of the LED 120a inside the device bounding area R1 and the second lead 124d of the LED 120d inside the device bounding area R4 are connected to the corresponding outer lead 240a and the corresponding second outer lead 240b through the conductive material 130 to form a series loop serially connecting all the device bounding areas R1~R4, wherein the series loop is a circuit with four elements serially connected. That is to say, the light source module 100c of the present embodiment forms a loop with four elements serially connected through bridging the circuit layout 200 and the LEDs 120a~120d.

In a word, the light source modules 100a~100c of the present embodiment form different loops by selectively connecting the first leads 122 (122a~122d) of the LEDs 120 (120a~120d) to the corresponding first outer leads 240a or the corresponding bridging lines 230, and selectively connecting the second leads 124 (124a~124d) to the corresponding second outer leads 240b or the corresponding bridging lines 230, which is capable of using the circuit substrate 110 in various light source modules with different loop designs by selectively serially or parallelly connecting the first leads 122 (122a~122d) and the second leads 124 (124a~124d) of the LEDs 120 (120a~120d).

Figure 5A:
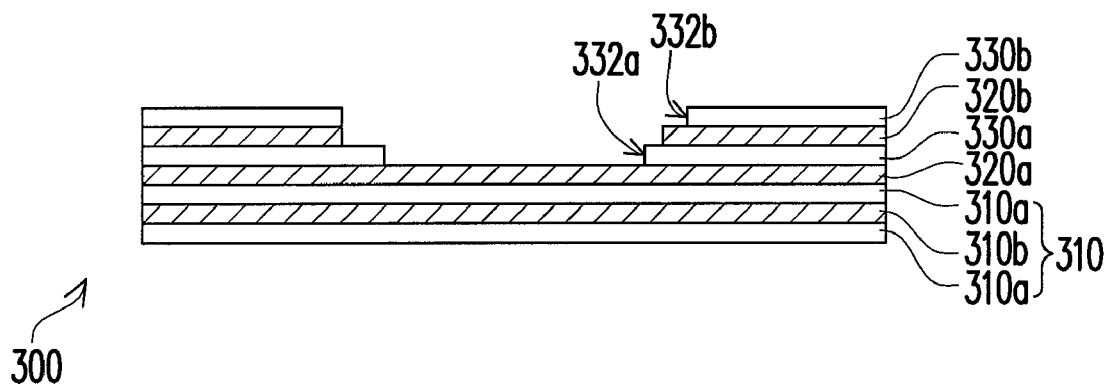
FIG. 5A is a schematic cross-sectional view of a circuit substrate according to an embodiment of the present invention.

FIG. 5A is a schematic cross-sectional view of a circuit substrate according to an embodiment of the present invention. Referring to FIG. 5A, the circuit substrate 300 includes a base layer 310, a first conductive layer 320a, a second conductive layer 320b, a first dielectric layer 330a and a second dielectric layer 330b in the present embodiment. The first conductive layer 320a covers on the base layer 310, wherein the base layer 310 is, for example, a multi-layer plate which is formed by two dielectric layers 310a and one conductive layer 310b interlaced with one another. However, this should by no means limit the scope of the present invention. In other embodiments, the base layer 310 may be a dielectric layer 310a or formed by more than two dielectric layers 310a and more than two conductive layers 310b interlaced with one another.

The first dielectric layer 330a covers on the first conductive layer 320a and the first dielectric layer 330a has a first opening 332a. The first opening 332a exposes a portion of the underlying first conductive layer 320a. The second conductive layer 320b covers on the first dielectric layer 330a. The second dielectric layer 330b covers on the second conductive layer 320b and the second dielectric layer 330b has a second opening 332b. The second opening 332b exposes a portion of the underlying second conductive layer 320b and the second opening 332b is directly linked to the first opening 332a while the bore diameter of the second opening 332b is larger than that of the first opening 332a.

In a word, the conductive layers such as the first conductive layer 320a and the second conductive layer 320b of the circuit substrate 300 in the present embodiment and the dielectric layers such as the first dielectric layer 330a and the second dielectric layer 330b are interlaced with one another, and the circuit substrate 300 is configured with the openings such as the first opening 332a and the second opening 332b penetrating the dielectric layers such as the first dielectric layer 330a and the second dielectric layer 330b and the conductive layers such as the first conductive 320a and the second conductive layer 320b. The bore diameters of the openings corresponding to each of the dielectric layers and each of the conductive layers are gradually reduced toward the base layer 310 so that each of the dielectric layers exposes the underlying dielectric layers and the underlying conductive layers through the openings.

Figure 5B:
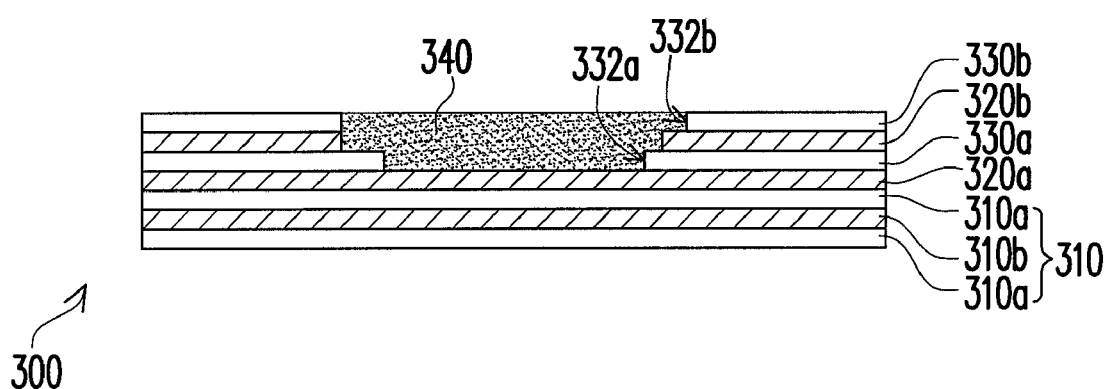
FIG. 5B is a schematic cross-sectional view of the circuit substrate of FIG. 5A provided with a conductive material.

FIG. 5B is a schematic cross-sectional view of the circuit substrate of FIG. 5A provided with a conductive material. Referring to FIG. 5B, the circuit substrate 300 further includes a conductive material 340, wherein the conductive material 340 is disposed in the first opening 332a and the second opening 332b. The conductive material 340 covers the portion of the first conductive layer 320a exposed by the first opening 332a and covers the portion of the second conductive layer 320b exposed by the second opening 332b so as to electrically connect the first conductive layer 320a and the second conductive layer 320b. In the present invention, the conductive material 340 includes a solder.

Since the first dielectric layer 330a and the second dielectric layer 330b of the circuit substrate 300 respectively have the first opening 332a and the second opening 332b, a user is capable of measuring the signal of the first conductive layer 320a through the portion of the first conductive layer 320a exposed by the first opening 332a, measuring the signal of the second conductive layer 320b through the portion of the second conductive layer 320b exposed by the second opening 332b, and electrically connecting to the first conductive layer 320a, or the second conductive layer 320b, or both the first conductive layer 320a and the second conductive layer 320b through the conductive material 340 as needed. Therefore, no plating through holes are needed in the circuit substrate 300 of the present invention for measuring the signal of the inner conductive layers such that the negative influence on the continuity between the conductive layers, the antenna effect, and the effect of electromagnetic interference are alleviated.

It is noted that the numbers of the dielectric layers and the conductive layers of the circuit substrate 300 are not limited in the present invention. Herein, the number of the dielectric layers is substantial two such as the first dielectric layer 330a and the second dielectric layer 330b, the number of the conductive layers is substantial two such as the first conductive layer 320a and the second conductive layer 320b. However, it is still applicable to the present invention, and is not departing from the scope of protection sought by the present invention that the openings penetrate the dielectric layer and the conductive layer, and the bore diameter of the openings corresponding to each of the dielectric layers and each of the conductive layers is gradually reduced toward the base layer 310 so that each of the dielectric layer is capable of exposing the underlying dielectric layers and the underlying conductive layers through the openings.

Figure 6A:
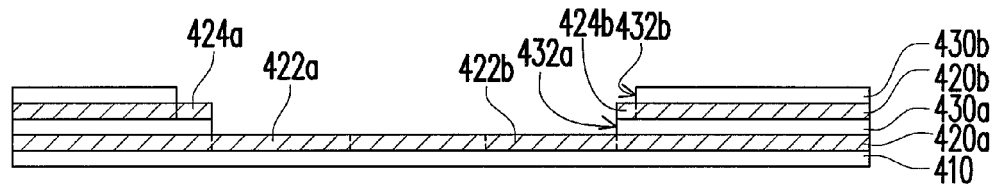
FIG. 6A is a schematic cross-sectional view of a circuit substrate according to another embodiment of the present invention.

FIG. 6A is a schematic cross-sectional view of a circuit substrate according to another embodiment of the present invention. Referring to FIG. 6A, the circuit substrate 400a of FIG. 6A is similar to the circuit substrate 300 of FIG. 5A in the present embodiment. The differences between the circuit substrate 400a and the circuit substrate 300 are that the base layer 410 of the circuit substrate 400a shown in FIG. 6A is a dielectric layer, a portion of the first conductive layer 420a exposed by the first opening 432a of the first dielectric layer 430a forms a first pad 422a and a second pad 422b, and a portion of the second conductive layer 420b exposed by the second opening 432b of the second dielectric layer 430b forms a third pad 424a and a fourth pad 424b.

Figure 6B:
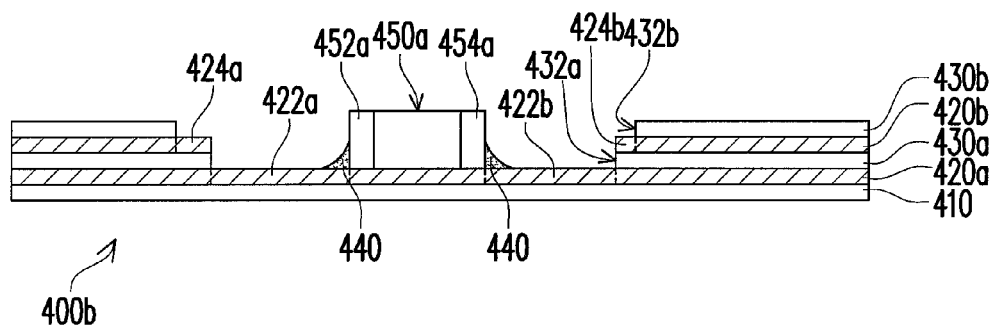
FIG. 6B is a schematic cross-sectional view of a circuit substrate according to another embodiment of the present invention.

FIG. 6B is a schematic cross-sectional view of a circuit substrate according to another embodiment of the present invention. Referring to FIG. 6B, the circuit substrate 400b of FIG. 6B is similar to the circuit substrate 400a of FIG. 6A and the difference between the two circuit substrates is that the circuit substrate 400b shown in FIG. 6B further includes a passive element 450a and a conductive material 440.

Specifically, the passive element 450a is disposed inside the first opening 432a of the first dielectric layer 430a and located on a portion of the first conductive layer 420a exposed by the first opening 432a. The passive element 450a has a first connection portion 452a and a second connection portion 454a. The conductive material 440 is disposed at a juncture of the first connection portion 452a of the passive element 450a and the first pad 422a exposed by the first opening 432a, and at a juncture of the second connection portion 454a of the passive element 450a and the second pad 422b exposed by the first opening 432a. The first connection portion 452a and the second connection portion 454a are respectively bridged to the first pad 422a and the second pad 422b exposed by the first opening 432a so as to electrically connect the passive element 450a and the first conductive layer 420a. In the present embodiment, the passive element 450a is a zero-omhic resistor.

Figure 6C:
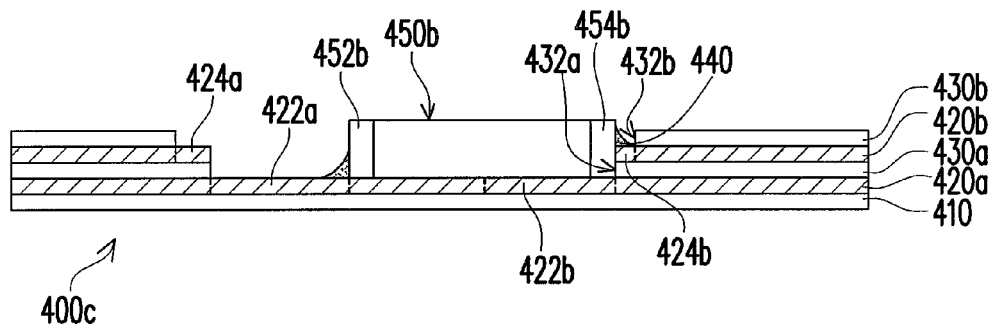
FIG. 6C is a schematic cross-sectional view of a circuit substrate according to another embodiment of the present invention.

FIG. 6C is a schematic cross-sectional view of a circuit substrate according to another embodiment of the present invention. The circuit substrate 400c of FIG. 6C is similar to the circuit substrate 400b of FIG. 6B and the difference between the two circuit substrates is that the conductive material 440 of the circuit substrate 400c shown in FIG. 6C is disposed at a juncture of the first connection portion 452b of the passive element 450b and the first pad 422a exposed by the first opening 432a, and at a juncture of the second connection portion 454b and the fourth pad 424b exposed by the second opening 432b. The first connection portion 452b of the passive element 450b is bridged to the first pad 422a through the conductive material 440, and the second connection portion 454b of the passive element 450b is bridged to the fourth pad 424b through the conductive material 440 such that the passive element 450b is electrically connected to the first conductive layer 420a and a portion of the second conductive layer 420b. In the present embodiment, the passive element 450b is a zero-omhic resistor.

Figure 6D:
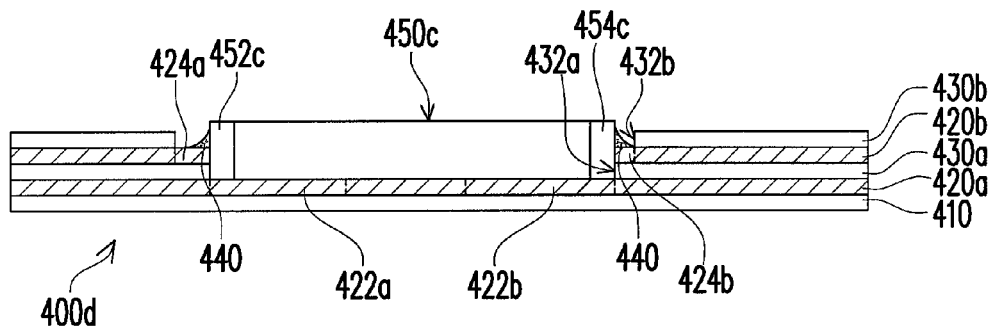
FIG. 6D is a schematic cross-sectional view of a circuit substrate according to another embodiment of the present invention.

FIG. 6D is a schematic cross-sectional view of a circuit substrate according to another embodiment of the present invention. The circuit substrate 400d of FIG. 6D is similar to the circuit substrate 400b of FIG. 6B and the difference between the two circuit substrates is that the conductive material 440 of the circuit substrate 400d shown in FIG. 6D is disposed at a junction of the first connection portion 452c of the passive element 450c and the third pad 424a exposed by the second opening 432b, and at a juncture of the second connection portion 454c and the fourth pad 424b exposed by the second opening 432b. The first connection portion 452b of the passive element 450b is bridged to the third pad 424a through the conductive material 440, and the second connection portion 454c of the passive element 450c is bridged to the fourth pad 424b through the conductive material 440 such that the passive element 450b is electrically connected to the first conductive layer 420a and the second conductive layer 420b. In the present embodiment, the passive element 450c is a zero-omhic resistor.

In a word, in the circuit substrates 400a~400d of the present embodiment, the first dielectric layer 430a has the first opening 432a exposing the portion of the underlying first conductive layer 420a, and the second dielectric layer 430b has the second opening 432b exposing the portion of the underlying second conductive layer 420b, wherein the bore diameter of the second opening 432b is larger than the bore diameter of the first opening 432a, and the second opening 432b is directly linked to the first opening 432a. When the passive elements 450a~450c are disposed inside the first opening 432a of the first dielectric layer 430a, the passive element 450a~450c is capable of being selectively connected to the first pad 422a, the second pad 422b, the third pad 424a or the fourth pad 424b through the conductive material 440 to electrically connect the conductive layers as needed and therefore, additional jump pins or resistors are not required to reduce the manufacturing cost.

In view of the above, the circuit layout of the present invention is designed to be constructed by the first pads, the second pads, the bridging lines and the outer leads. The first leads and the second leads of the LEDs are respectively disposed on the corresponding first pads and the corresponding second pads. Therefore, the LEDs are selectively bridged to the corresponding outer leads or the bridging lines through the first leads and the second leads to form different loop designs. Accordingly, the circuit substrate having the circuit layout of the present invention is capable of letting the LEDs be selectively serially connected together or parallel connected together to accomplish different light source modules. That is to say, the circuit substrate of the present invention is capable of being used in various light source modules with different circuit designs and the utility of the circuit substrate of the present invention is largely improved.

In addition, the circuit substrate of the present invention is configured with the opening penetrating the dielectric layers and the conductive layers, and the bore diameter of the opening corresponding to each of the dielectric layers or each of the conductive layers is gradually reduced toward the base layer, which makes each of the dielectric layers expose the underlying dielectric layers and the underlying conductive layers through the opening, and therefore, the user is capable of directly measuring the signal of a portion of the conductive layers exposed by the dielectric layer through the opening, and electrically connecting numbers of conductive layers through the conductive material as needed. Thus, the effect of electromagnetic interference in the circuit substrate is alleviated. Furthermore, when the passive elements are disposed inside the opening of the dielectric layer adjacent to the base layer, numbers of the conductive layers is electrically connected by bridging the passive elements and the pads as needed and thus additional jump pins or resistors are not required. Accordingly, the circuit substrate of the present invention is capable of letting the user efficiently measure the signal of the inner conductive layers without adding the manufacturing cost.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit layout of a circuit substrate, the circuit layout comprising:
    a plurality of circuit units, wherein a pattern of each of the plurality of circuit units is identical to a pattern of any other circuit unit, and each of the plurality of circuit units comprises a first pad, a second pad, a first outer lead adjacent the first pad, and a second outer lead adjacent the second pad; and
    a plurality of bridging lines respectively disposed between any two adjacent circuit units, wherein each of the plurality of bridging lines is extended from the first pad of one circuit unit to the second pad of another circuit unit.

2. The circuit layout of the circuit substrate of claim 1, wherein the first pad of each of the plurality of circuit units is alternatively bridged to the first outer lead of the same circuit unit or the corresponding bridging line, and the second pad of the same circuit unit is alternatively bridged to the second outer lead of the same circuit unit or the corresponding bridging line.

3. The circuit layout of the circuit substrate of claim 2, wherein the first pad of each of the plurality of circuit units is bridged to the first outer lead of the same circuit unit and isolated from all of the bridging lines, and the second pad of the same circuit unit is bridged to the second outer lead of the same circuit unit and isolated from all of the bridging lines.

4. The circuit layout of the circuit substrate of claim 2, wherein every two or more adjacent circuit units are grouped into a set of the circuit units, the outermost first pad of each set of the circuit units is bridged to the corresponding first outer lead and isolated from all of the bridging lines, the outermost second pad of the same set of the circuit units is bridged to the corresponding second outer lead and isolated from all of the bridging lines, and the remaining first pads and second pads are connected by their corresponding bridging lines.

5. The circuit layout of the circuit substrate of claim 2, wherein the outermost first pad of the plurality of circuit units is bridged to the corresponding first outer lead and isolated from all of the bridging lines, the outermost second pad of the plurality of circuit units is bridged to the corresponding second outer lead and isolated from all of the bridging lines and the remaining first pads and second pads are connected by their corresponding bridging lines.

6. The circuit layout of the circuit substrate of claim 2, further comprising a first conductive material disposed at a juncture of the first pads and their corresponding first outer leads or bridging lines, and a second conductive material disposed at a juncture of the second pads and their corresponding second outer leads or bridging lines.

7. A light source module, comprising:
    a circuit substrate, comprising:
        a first dielectric layer;
        a second dielectric layer having a plurality of openings;
        a patterned metal layer disposed between the first dielectric layer and second dielectric layer, wherein a portion of the patterned metal layer is exposed by the openings of the second dielectric layer and comprises a circuit layout, and the circuit layout comprises:
            a plurality of circuit units, wherein a pattern of each of the plurality of circuit units is identical to a pattern of any other circuit unit, and each of the plurality of circuit units comprises a first pad, a second pad, a first outer lead adjacent the first pad, and a second outer lead adjacent the second pad; and
            a plurality of bridging lines respectively disposed between any two adjacent circuit units, wherein each of the plurality of bridging lines is extended from the first pad of one circuit unit to the second pad of another circuit unit; and
    a plurality of light emitting diodes (LEDs) respectively disposed on the plurality of circuit units, wherein each of the LEDs having a first lead bonded to the first pad of the corresponding circuit unit and a second lead bonded to the second pad of the corresponding circuit unit.

8. The light source module of claim 7, wherein the first pad of each of the plurality of circuit units is alternatively bridged to the first outer lead of the same circuit unit or the corresponding bridging line, and the second pad of the same circuit unit is alternatively bridged to the second outer lead of the same circuit unit or the corresponding bridging line.

9. The light source module of claim 8, wherein the first pad of each of the plurality of circuit units is bridged to the first outer lead of the same circuit unit and isolated from all of the bridging lines, and the second pad of the same circuit unit is bridged to the second outer lead of the same circuit unit and isolated from all of the bridging lines.

10. The light source module of claim 8, wherein every two or more adjacent circuit units are grouped into a set of the circuit units, the outermost first pad of each set of the circuit units is bridged to the corresponding first outer lead and isolated from all of the bridging lines, the outermost second pad of the same set of the circuit units is bridged to the corresponding second outer lead and isolated from all of the bridging lines, and the remaining first pads and second pads are connected by their corresponding bridging lines.

11. The light source module of claim 8, wherein the outermost first pad of the plurality of circuit units is bridged to the corresponding first outer lead and isolated from all of the bridging lines, the outermost second pad of the plurality of circuit units is bridged to the corresponding second outer lead and isolated from all of the bridging lines and the remaining first pads and second pads are connected by their corresponding bridging lines.

12. The circuit layout of the circuit substrate of claim 8, further comprising a first conductive material disposed at a juncture of the first leads and their corresponding first outer leads or bridging lines, and a second conductive material disposed at a juncture of the second leads and their corresponding second outer leads or bridging lines.

* * * * *

UNITED STATES PATENT AND TRADEMARK OFFICE
CERTIFICATE OF CORRECTION

PATENT NO.         : 8,258,623 B2
APPLICATION NO.    : 12/538180
DATED              : September 4, 2012
INVENTOR(S)        : Lee et al.

It is certified that error appears in the above-identified patent and that said Letters Patent is hereby corrected as shown below:

On the cover page of the patent grant, the item (75) third Inventor's name "Hun-Hsiang Chen" should be changed to --Hung-Hsiang Chen--.

Signed and Sealed this
Sixth Day of November, 2012

David J. Kappos
*Director of the United States Patent and Trademark Office*